(12) United States Patent
Adkisson et al.

(10) Patent No.: US 7,089,514 B2
(45) Date of Patent: Aug. 8, 2006

(54) DEFECT DIAGNOSIS FOR SEMICONDUCTOR INTEGRATED CIRCUITS

(75) Inventors: James W. Adkisson, Jericho, VT (US); Greg Bazan, Essex Junction, VT (US); John M. Cohn, Richmond, VT (US); Francis Gravel, Westford, VT (US); Leendert M. Huisman, South Burlington, VT (US); Phillip J. Nigh, Williston, VT (US); Leah M. P. Pastel, Essex, VT (US); Kenneth Rowe, Burlington, VT (US); Thomas G. Sopchak, Williston, VT (US); David E. Sweenor, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 10/710,879

(22) Filed: Aug. 10, 2004

(65) Prior Publication Data

US 2006/0036975 A1   Feb. 16, 2006

(51) Int. Cl.
*G06F 17/50* (2006.01)
(52) U.S. Cl. ............... 716/4; 716/5; 702/35; 714/732
(58) Field of Classification Search ............... 716/4–5; 702/35; 714/732
See application file for complete search history.

(56) References Cited

U.S. PATENT DOCUMENTS 4,947,357 A   8/1990   Stewart et al.
5,917,332 A * 6/1999   Chen et al. ............... 324/765
5,923,553 A   7/1999   Yi (Continued)

FOREIGN PATENT DOCUMENTS

EP   014661   12/1986

OTHER PUBLICATIONS

K. W. Lallier et al., Relating Logic Design to Physical Geometry in LSI Chip, vol. 19, No. 6, Nov. 1976, pp. 2140-2143.

*Primary Examiner*—Paul Dinh
*Assistant Examiner*—Tuyen To
(74) *Attorney, Agent, or Firm*—Schmeiser, Olsen & Watts; Richard M. Kotulak

(57) ABSTRACT

A method for defect diagnosis of semiconductor chip. The method comprises the steps of (a) identifying M design structures and N physical characteristics of the circuit design, wherein M and N are positive integers, wherein each design structure of the M design structures is testable as to pass or fail, and wherein each physical characteristic of the N physical characteristics is present in at least one design structure of the M design structures; (b) for each design structure of the M design structures of the circuit design, determining a fail rate and determining whether the fail rate is high or low; and (c) if every design structure of the M design structures in which a physical characteristic of the N physical characteristics is present has a high fail rate, then flagging the physical characteristic as being likely to contain at least a defect.

20 Claims, 3 Drawing Sheets

U.S. PATENT DOCUMENTS

| | | |
|---|---|---|
| 6,185,707 B1 | 2/2001 | Smith et al. |
| 6,292,582 B1 * | 9/2001 | Lin et al. .................... 382/149 |
| 6,308,290 B1 | 10/2001 | Forlenza et al. |
| 6,347,386 B1 | 2/2002 | Beffa |
| 6,524,873 B1 | 2/2003 | Satya et al. |
| 6,566,885 B1 | 5/2003 | Pinto et al. |
| 6,605,956 B1 | 8/2003 | Farnworth et al. |
| 6,636,064 B1 | 10/2003 | Satya et al. |
| 6,751,765 B1 * | 6/2004 | Rizzolo et al. ............. 714/732 |
| 6,766,274 B1 * | 7/2004 | Puthucode .................. 702/181 |
| 6,971,054 B1 * | 11/2005 | Kurtulik et al. ............ 714/732 |
| 2004/0254752 A1 * | 12/2004 | Wisniewski et al. .......... 702/84 |

* cited by examiner

|  | PC1 | PC2 | PC3 | PC4 | PC5 | Fail Rate | High Fail Rate |
|---|---|---|---|---|---|---|---|
| SC1 | 1 | 1 | 0 | 1 | 0 | 80% | 1 |
| SC2 | 0 | 1 | 0 | 1 | 0 | 10% | 0 |
| SC3 | 0 | 1 | 1 | 1 | 1 | 90% | 1 |
| SC4 | 0 | 0 | 0 | 1 | 1 | 15% | 0 |
| SC5 | 0 | 0 | 1 | 1 | 0 | 75% | 1 |
| SC6 | 0 | 0 | 0 | 1 | 0 | 30% | 0 |
| Flagged as being likely to contain at least a defect? | Yes | No | Yes | No | No |  |  |

DEFECT DIAGNOSIS FOR SEMICONDUCTOR INTEGRATED CIRCUITS

BACKGROUND OF INVENTION

1. Technical Field

The present invention relates to defect diagnosis, and more particularly, to defect diagnosis to determine defect level(s) and location(s) in defective semiconductor integrated circuits.

2. Related Art

Fabrication of integrated circuits (chips) of the same design may result in defects in some or all of the chips. If the defect locations in the defective chips are known, the structures at the defect locations can be delayered to determine which fabrication process(es) caused the defects.

Therefore, a method for determining defect locations in the defective chips is needed.

SUMMARY OF INVENTION

The present invention provides a method for defect diagnosis of a circuit design, the method comprising the steps of (a) identifying M design structures and N physical characteristics of the circuit design, wherein M and N are positive integers, wherein each design structure of the M design structures is testable as to pass or fail, and wherein each physical characteristic of the N physical characteristics is present in at least one design structure of the M design structures; (b) for each design structure of the M design structures of the circuit design, determining a fail rate and determining whether the fail rate is high or low; and (c) if every design structure of the M design structures in which a physical characteristic of the N physical characteristics is present has a high fail rate, then flagging the physical characteristic as being likely to contain at least a defect.

The present invention also provides a method for defect diagnosis of a circuit design, the method comprising the steps of (a) identifying M design structures and N physical characteristics of the circuit design, wherein M and N are positive integers, wherein each design structure of the M design structures is testable as to pass or fail, and wherein each physical characteristic of the N physical characteristics is present in at least one design structure of the M design structures; (b) determining a fail rate for each design structure of the M design structures of the circuit design; and (c) analyzing the fail rates of a plurality of design structures of the M design structures so as to determine whether to flag the physical characteristic as being likely to contain at least a defect.

The present invention also provides computer program product, comprising a computer usable medium having a computer readable program code embodied therein, said computer readable program code comprising an algorithm adapted to implement a method for analyzing defects of a circuit design, wherein a fail rate for each of a plurality of design structures is provided, said method comprising the steps of (a) identifying M design structures from the plurality of design structures and N physical characteristics of the circuit design, wherein M and N are positive integers, and wherein each physical characteristic of the N physical characteristics is present in at least one design structure of the M design structures; (b) for each design structure of the M design structures of the circuit design, determining whether the fail rate of the design structure is high or low; and (c) if every design structure of the M design structures in which a physical characteristic of the N physical characteristics is present has a high fail rate, then flagging the physical characteristic as being likely to contain at least a defect.

The present invention provides the advantage of a method for determining (in terms of manufacturing levels) defect locations in defective chips.

DETAILED DESCRIPTION

Figure 1:
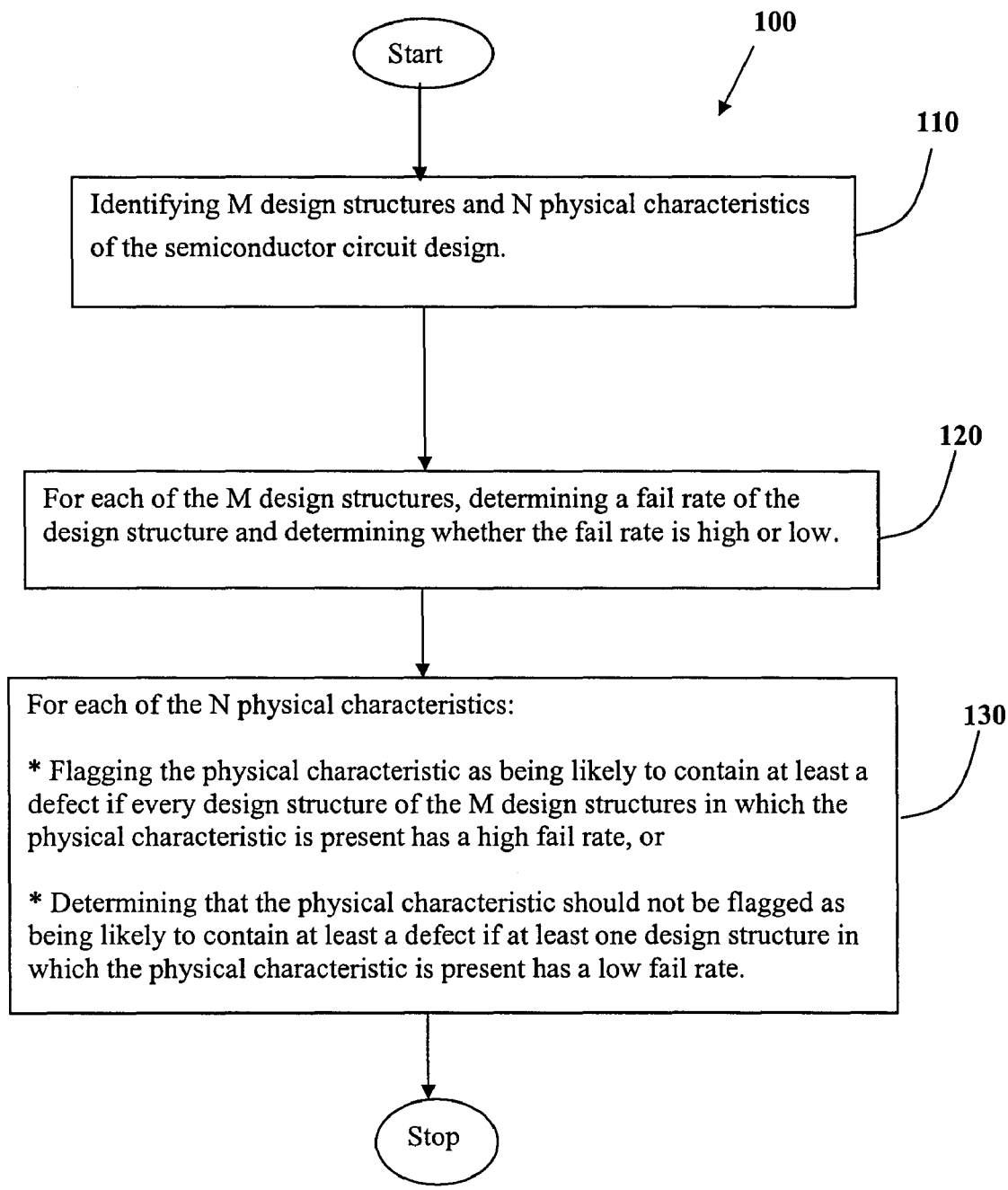
FIG. 1 illustrates a flow chart of a method for determining the defect locations in defective chips of the same circuit design, in accordance with embodiments of the present invention.

FIG. 1 illustrates a flow chart of a method 100 for determining the defect locations in defective circuits of the same circuit design (not shown), in accordance with embodiments of the present invention. In one embodiment, the method 100 starts with step 110 in which M design structures and N physical characteristics of the circuit design are identified, such that (a) M and N are positive integers, (b) each of the M design structures is testable as to pass or fail with respect to, in one embodiment, functionality, and (c) each of the N physical characteristics is present in at least one of the M design structures.

For example, assume that six scan chains, namely, SC1, SC2, SC3, SC4, SC5 and SC6 (i.e., M=6) and five physical characteristics, namely, PC1, PC2, PC3, PC4, and PC5 (i.e., N=5) are identified in the circuit design. Assume further that each of the six scan chains SC1, SC2, SC3, SC4, SC5 and SC6 can be tested so as to determine whether the tested scan chain passes or fails functionally. Assume even further that each characteristic of the five physical characteristics PC1, PC2, PC3, PC4, and PC5 is present in at least one of the six scan chains SC1, SC2, SC3, SC4, SC5 and SC6.

Examples of physical characteristics include, among others, the characteristics of comprising a particular wiring level, residing in certain metal levels, sharing a particular interconnect level, having a certain number (or range) of latches, having a particular type or design of circuit, physically placed in one section of the chip physical layout, etc. For the descriptions infra, assume that physical characteristic PC1=comprising a particular wiring level.

In one embodiment, chip design software tools (e.g., Chipbench Niagra, Hercules, etc.) can be used to help determine the presence or non-presence of a physical characteristic in a scan chain of the circuit design. More specifically, circuit design data and the integrated circuit netlist can be fed into the chip design software tool which processes the circuit design data and netlist so as to determine the presence or non-presence of a physical characteristic in a scan chain.

Figure 2:
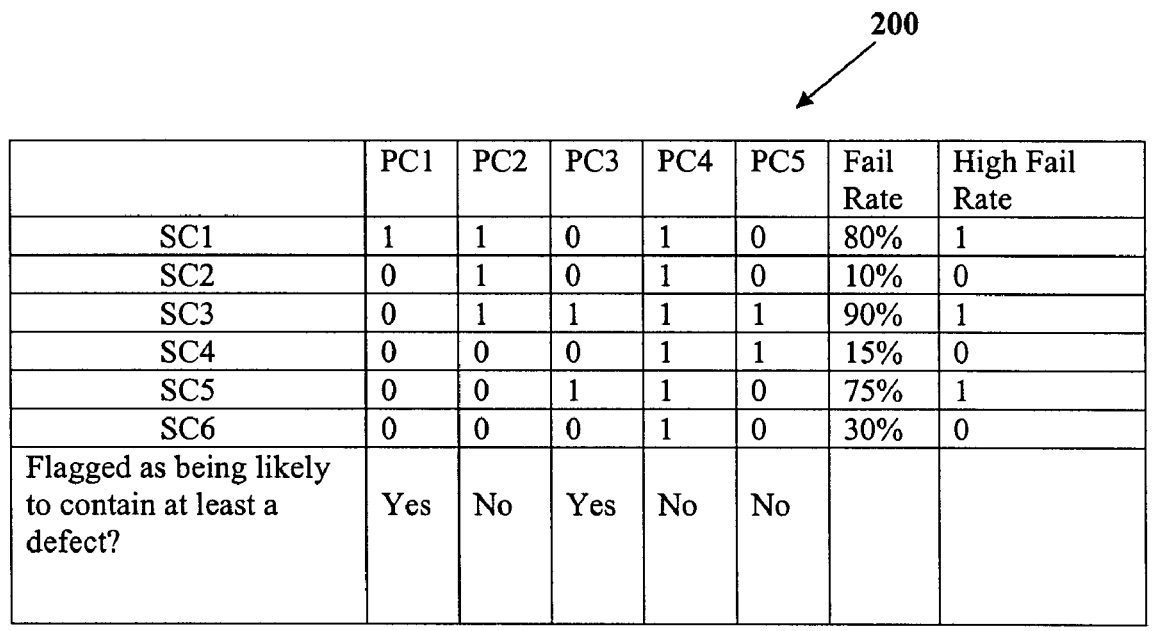
FIG. 2 shows a table illustrating an example of the application of the method of FIG. 1.

In one embodiment, the presence/non-presence of each of the 5 physical characteristics in the 6 scan chains SC1, SC2, SC3, SC4, SC5 and SC6 can be summarized in a table 200 of FIG. 2. With reference to FIG. 2, the presence of a physical characteristic in a scan chain can be indicated by a "1" in the cell located at the intersection of the row of that scan chain and the column of that physical characteristic. In contrast, the non-presence of a physical characteristic in a scan chain can be indicated by a "0" in the cell located at the intersection of the row of that scan chain and the column of that physical characteristic. For instance, the "1" in the cell located at the intersection of row SC1 and column PC1 indicates that scan chain SC1 has the physical characteristic PC1 (hereafter, for simplicity, the name of scan chain is also used as the name of the row in table 200, and the name of physical characteristic is also used as the name of the column in table 200). In contrast, the "0" in the cell located at the intersection of row SC1 and column PC3 indicates that scan chain SC1 does not have physical characteristic PC3. The values in table 200 are for illustration only.

In step 120 of method 100 (FIG. 1), for each of the M design structures, a fail rate is determined and then it is determined whether that fail rate is high or low. In one embodiment, the scan chains of multiple identical chips of the circuit design can be functionally tested as to pass or fail so as to determine a fail rate for each scan chain and to determine whether the fail rate is high or low. Failures used to determine the fail rates can be, inter alia, AC test only failures, low VDD failures, IDDQ failures, speed failures, etc. In one embodiment, a failure can be defined as an event wherein a structure being tested fails a single functionality test or a group of functionality tests.

In the example supra, assume illustratively that 1000 identical chips are built according to the circuit design. As a result, there are 1000 SC1, 1000 SC2, 1000 SC3, 1000 SC4, 1000 SC5, and 1000 SC6 to be tested. When all the 6000 scan chains have been tested, the total number of defective scan chains SC1, SC2, SC3, SC4, SC5 and SC6 can be obtained.

In the example supra, assume further that for the 6,000 scan chains SC1, SC2, SC3, SC4, SC5 and SC6 of the 1,000 chips (i.e., 1000 SC1, 1000 SC2, 1000 SC3, 1000 SC4, 1000 SC5, and 1000 SC6), testing has identified, illustratively, 800 defective scan chains SC1, 100 defective scan chains SC2, 900 defective scan chains SC3, 150 defective scan chains SC4, 750 defective scan chains SC5, and 300 defective scan chains SC6. As a result, the fail rate for each of the scan chains SC1, SC2, SC3, SC4, SC5 and SC6 in the circuit design can be calculated to be 80% (i.e., 800/1,000), 10% (i.e., 100/1,000), 90% (i.e., 900/1,000), 15% (i.e., 150/1,000), 75% (i.e., 750/1,000), and 30% (i.e., 300/1,000), respectively (as shown in Fail Rate column of FIG. 2).

Assume further that a fail rate is considered a high fail rate if it is greater than or equal to, illustratively, 50% and is considered a low fail rate otherwise. As a result, the fail rates of scan chains SC1, SC3, and SC5 of 80%, 90%, and 75%, respectively, are considered high and are indicated by, illustratively, a "1" in the High Fail Rate column and corresponding rows in table 200 (FIG. 2). In contrast, the fail rates of scan chains SC2, SC4, and SC6 of 10%, 15%, and 30%, respectively, are considered low and are indicated by, illustratively, a "0" in the High Fail Rate column and corresponding rows in table 200 (FIG. 2).

In step 130 (FIG. 1) of the method 100, in one embodiment, the high and low fail rates of the M design structures (i.e., scan chains) are analyzed against the presence and non-presence of each of the N physical characteristics in the scan chains so as to determine whether to flag the physical characteristic as being likely to contain at least a defect in the scan chain(s) in which the physical characteristic is present. More specifically, in step 130 (FIG. 1), in one embodiment, a physical characteristic is flagged as being likely to contain at least a defect if every design structure of the M design structures in which the physical characteristic is present has a high fail rate. However, the physical characteristic is not flagged as being likely to contain at least a defect if at least one design structure in which the physical characteristic is present has a low fail rate.

The reasoning for the step 130 (FIG. 1) can be explained as follows. Assume that the present physical characteristic contains at least a defect. As a result, all scan chains containing the present physical characteristic can be considered failing scan chains. If all such alleged failing scan chains have high fail rates, then the assumption that the present physical characteristic contains at least a defect is likely true, and therefore the present physical characteristic should be flagged as being likely to contain at least a defect. However, if at least one of such alleged failing scan chains has a low fail rate, then the assumption that the present physical characteristic contains at least a defect is likely not true, and therefore the present physical characteristic should not be flagged as being likely to contain at least a defect.

In the example supra, with reference to both FIGS. 1 and 2, in step 130, physical characteristic PC1 is flagged as being likely to contain at least a defect because all the scan chains of the 6 scan chains in which the physical characteristic PC1 is present (i.e., SC1) have a high fail rate (80%).

Similarly, physical characteristic PC3 is flagged as being likely to contain at least a defect because all the scan chains of the 6 scan chains in which the physical characteristic PC3 is present (i.e., SC3 and SC5) have high fail rates (90% and 75%, respectively).

In contrast, physical characteristic PC2 is not flagged as being likely to contain at least a defect because at least one of the 6 scan chains in which the physical characteristic PC2 is present (i.e., SC2) has a low fail rate (10%).

Similarly, physical characteristic PC4 is not flagged as being likely to contain at least a defect because at least one of the 6 scan chains in which the physical characteristic PC4 is present (i.e., SC2) has a low fail rate (10%).

Similarly, physical characteristic PC5 is not flagged as being likely to contain at least a defect because at least one of the 6 scan chains in which the physical characteristic PC5 is present (i.e., SC4) has a low fail rate (15%).

In one embodiment, each of the physical characteristics flagged in step 130 can be further analyzed for defects using any available failure analysis technique(s). In one embodiment, these flagged physical characteristics can be delayered (i.e., removing layers sequentially by, inter alia, etching) and inspected for defects. In one embodiment, one or more failing design structures which contain the flagged physical characteristic can be inspected for possible defect(s) at locations of the physical characteristic. In the example supra, one or more of the 800 failing scan chains SC1 which comprises the flagged physical characteristic PC1 (i.e., the characteristic of comprising the particular wiring level) can be delayered to look for possible defect(s) at the particular wiring level (i.e., PC1).

In the description of the method 100 supra, scan chains in the circuit design are used as a means to determine the defect locations in defective chips of the same circuit design. In general, any circuit structures that can be individually tested for functionality (i.e., can be determined as pass or fail) can be used. Examples include, among others, memories, cores, macros, etc.

In the description of the method 100 supra, each of the M design structures is testable as to pass or fail functionally. In general, any test criterion that can be phrased as a pass/fail can be used (i.e., not necessarily limited to functionality).

In the embodiments described above, the fail rate of each of the M design structures is determined by individually testing each of the M design structures. In general, as long as a pass/fail determination for each design structure can be obtained, the M design structures do not have to be individually tested.

In summary, the present invention provides a method for determining the likely location of a systematic failure mode or mechanism down to at least a process level (or subset of process levels) by characterizing the critical content of each scan chain by level and then using statistical analysis to detect correlations between the amount of each type of content at each level and the corresponding scan chain yields.

In the embodiments above, 50% is used as a threshold value in determining whether a fail rate is high or low. In general, the threshold value can be any number less than 100%. However, if the threshold value is chosen too high (i.e., close to 100%), most of the fail rates would be considered low. As a result, too few physical characteristics would be flagged. On the other hand, if the threshold value is chosen too low (i.e., close to 0%), most of the fail rates would be considered high. As a result, too many physical characteristics would be flagged, and therefore, delayering would have to be performed for almost all physical characteristics. In short, the threshold value should be chosen based on the resources and time available for performing the delayering process. If the resources and time available for performing the delayering process are abundant, then a lower threshold value can be chosen. In addition, in the embodiments described above, for illustration, the fail rate threshold value of 50% is chosen for all M design structures (i.e., 6 scan chains). In general, a fail rate threshold value can be independently chosen for each of the M design structures (i.e., each of the M design structures can have a different fail rate threshold value).

Figure 3:
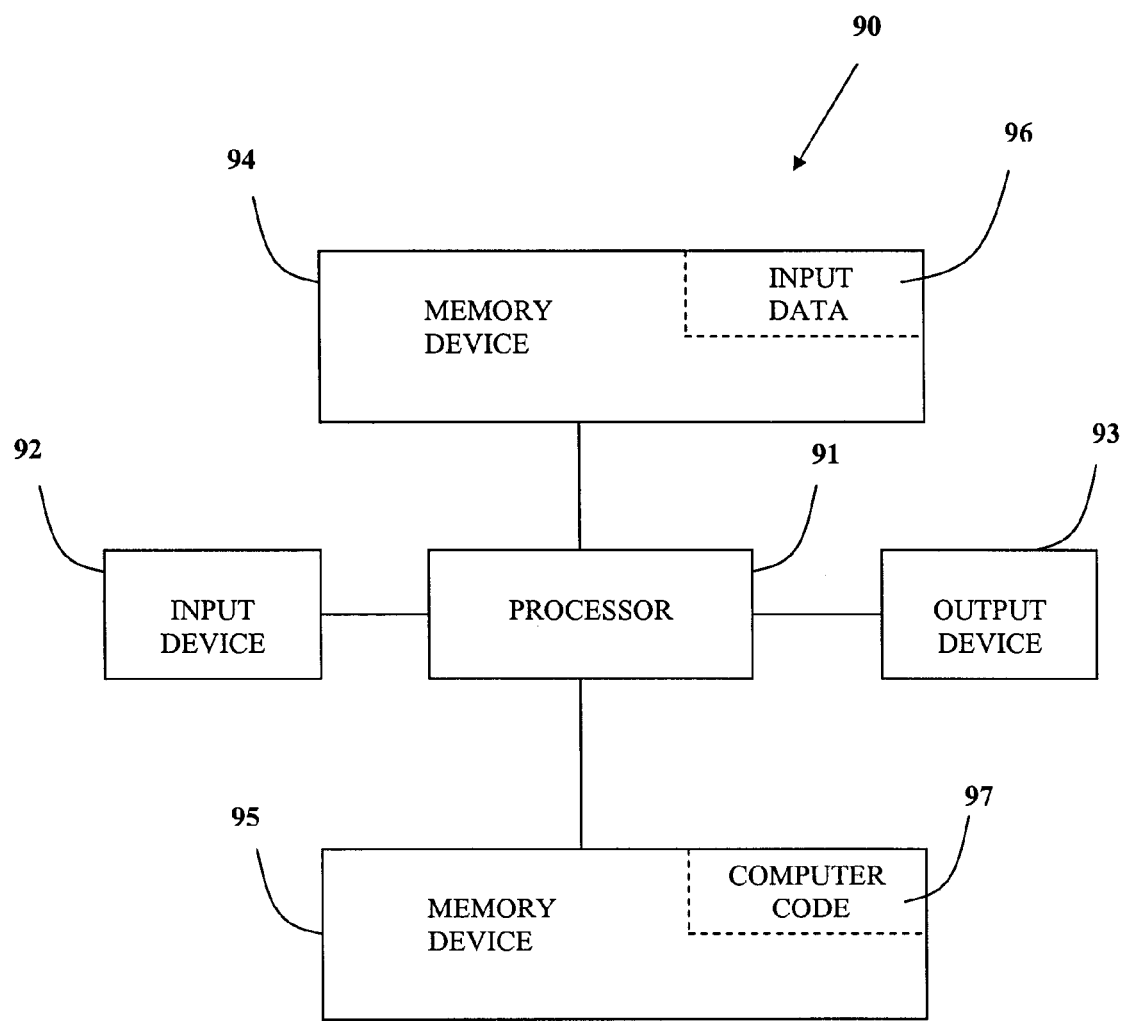
FIG. 3 illustrates a computer system used for carrying out the method of FIG. 1, in accordance with embodiments of the present invention.

FIG. 3 illustrates a computer system 90 used for analyzing defects of the circuit design, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes computer code 97. The computer code 97 includes an algorithm for analyzing defects of the circuit design. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 3) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 3 shows the computer system 90 as a particular configuration of hardware and software, any configuration of hardware and software, as would be known to a person of ordinary skill in the art, may be utilized for the purposes stated supra in conjunction with the particular computer system 90 of FIG. 3. For example, the memory devices 94 and 95 may be portions of a single memory device rather than separate memory devices.

In one embodiment, a determination whether to flag a the physical characteristic as being likely to contain at least a defect can be made based on the analysis of the fail rates of some or all the M design structures. For instance, with reference to FIG. 2, for PC1, the analysis of the fail rates of SC1 and SC2 shows that PC1 should be flagged as being likely to contain at least a defect. More specifically, by comparison between rows SC1 and SC2, it can be observed that all PCs of SC1, except for PC1, are present in SC2. On the other hand, SC1 has a high fail rate of 80%, whereas SC2 has a low fail rate of 10%. Therefore, it can be inferred that the presence of PC1 in SC1 is likely to cause SC1 to suffer the high fail rate. As a result, PC1 should be flagged as being likely to contain at least a defect.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method for defect diagnosis of a circuit design, the method comprising the stops of:
   (a) identifying M design structures and N physical characteristics of the circuit design,
      wherein M and N are positive integers,
      wherein each design structure of the M design structures is testable as to pass or fail, and
      wherein each physical characteristic of the N physical characteristics is present in at least one design structure of the M design structures;
   (b) for each design structure of the M design structures of the circuit design, determining a fail rate and determining whether the fail rate is high or low; and
   (c) if every design structure of the M design structures in which a physical characteristic of the N physical characteristics is present has a high fail rate, then flagging the physical characteristic as containing at least a defect.

2. The method of claim 1, wherein each of the M design structures comprises a design circuit selected from the group consisting of a design scan chain, a design memory cell, and a design macro.

3. The method of claim 2, wherein each of the M design structures comprises a design scan chain.

4. The method of claim 1, further comprising the step of, if at least one design structure of the M design structures in which a physical characteristic is present has a low fail rate, then determining that the physical characteristic should not be flagged as containing at least a defect.

5. The method of claim 1, further comprising the step of delayering and inspecting a structure with the flagged physical characteristic for defects.

6. The method of claim 1, wherein the step of determining the fail rate for each design structure of the M structure of the circuit design comprises the steps of:
   providing P circuits of the design structure, wherein P is a positive integer, and wherein P is selected independently for each design structure of the M design structures, testing each circuit of the P circuits so as to determine whether each circuit passes or fails so as to determine the number of failing circuits of the P circuits; and determining the fail rate of the design structure from P and the number of failing circuits of the P circuits from said testing.

7. The method of claim 6, wherein P is a same number for all M design structures.

8. The method of claim 7, wherein for each design structure of the M design structures, the P circuits of the design structure reside in a corresponding set of P identical chips for all the M design structures.

9. The method of claim 1, wherein the step of determining whether the fail rate is high or low comprises the step of determining that the design structure has a high fail rate if the fail rate of the design structure equals or exceeds an independently prespecified threshold fail rate.

10. The method of claim 1, wherein the step of determining whether the fail rate is high or low comprises the step of determining that the design structure has a low fail rate if the fail rate of the design structure is less than an independently pre-specified threshold fail rate.

11. A method for defect diagnosis of a circuit design, the method comprising the steps of:
(a) identifying M design structures and N physical characteristics of the circuit design,
wherein M and N arc positive integers,
wherein each design structure of the M design structures is testable as to pass or fail, and
wherein each physical characteristic of the N physical characteristics is present in at least one design structure of the M design structures;
(b) determining a fail rate for each design structure of the M design structures of the circuit design; and
(c) analyzing the fail rates of a plurality of design structures of the M design structures so as to determine whether to flag the physical characteristic as containing at least a defect.

12. The method of claim 11, wherein the step of analyzing the fail rates comprises the steps of:
for each fail rate of a design structure of the M design structures, determining whether the fail rate is high or low; and
if every design structure of the M design structures in which the physical characteristic of the N physical characteristics is present has a high fail rate, flagging the physical characteristic as containing at least a defect.

13. The method of claim 11, wherein the step of identifying the M design structures and the N physical characteristics of the circuit design comprises the step of:
providing circuit design data and netlist for the circuit design; and
using software to process the circuit design data and netlist so as to identify the M design structures and the N physical characteristics of the circuit design.

14. The method of claim 13, wherein the step of analyzing the fail rates comprises the steps of:
for each rail rate of a design structure of the M design structures, determining whether the fail rate is high or low; and if all physical characteristics present in a first design structure are also present in a second design structure, except for a present physical characteristic which is present in the first design structure but not in the second design structure, and if the first design structure has a high fail rate and the second design structure has a low fail rate, then flagging the present physical characteristic as containing at least a defect.

15. A computer program product, comprising a computer usable medium having a computer readable program code embodied therein, said computer readable program code comprising an algorithm adapted to implement a method for analyzing defects of a circuit design, wherein a fail rate for each of a plurality of design structures is provided, said method comprising the steps of:
(a) identifying M design structures from the plurality of design structures and N physical characteristics of the circuit design,
wherein M and N are positive integers, and
wherein each physical characteristic of the N physical characteristics is present in at least one design structure of the M design structures;
(b) for each design structure of the M design structures of the circuit design, determining whether the fail rate of the design structure is high or low; and
(c) if every design structure of the M design structures in which a physical characteristic of the N physical characteristics is present has a high fail rate, then flagging the physical characteristic as containing at least a defect.

16. The computer program product of claim 15, wherein each of the M design structures comprises a design circuit selected from the group consisting of a design scan chain, a design memory cell, and a design macro.

17. The computer program product of claim 15, wherein each of the M design structures comprises a design scan chain.

18. The computer program product of claim 15, wherein the method further comprises the step of, if at least one design structure of the M design structures in which a physical characteristic is present has a low fail rate, then determining that the physical characteristic should not be flagged as containing at least a defect.

19. The computer program product of claim 15, wherein the step of determining whether the fail rate of the design structure is high or low comprises the step of determining that the design structure has a high fail rate if the fail rate of the design structure equals or exceeds an independently pre-specified threshold fail rate.

20. The computer program product of claim 15, wherein the step of determining whether the fail rate of the design structure is high or low comprises the step of determining that the design structure has a low fail rate if the fail rate of the design structure is less than an independently pre-specified threshold fail rate.

* * * * *

UNITED STATES PATENT AND TRADEMARK OFFICE
CERTIFICATE OF CORRECTION

| | | |
|---|---|---|
| PATENT NO. | : 7,089,514 B2 | Page 1 of 1 |
| APPLICATION NO. | : 10/710879 | |
| DATED | : August 8, 2006 | |
| INVENTOR(S) | : Adkisson et al. | |

It is certified that error appears in the above-identified patent and that said Letters Patent is hereby corrected as shown below:

<u>Column 7</u>
Line 27, delete "arc" and insert -- are --

Signed and Sealed this

Fourteenth Day of November, 2006

JON W. DUDAS
*Director of the United States Patent and Trademark Office*